United States Patent [19]

Gamble

[11] Patent Number: 4,845,424

[45] Date of Patent: Jul. 4, 1989

[54] ROTARY DISPLACEMENT MOTOR

[76] Inventor: John G. Gamble, 16 Milford St., Hall, Mass. 02045

[21] Appl. No.: 120,993

[22] Filed: Nov. 16, 1987

[51] Int. Cl.[4] .............................................. G01R 1/20
[52] U.S. Cl. .................................... 324/146; 324/144; 324/151 R
[58] Field of Search ................... 324/146, 144, 151 R, 324/97; 335/272, 229, 230

[56] References Cited

U.S. PATENT DOCUMENTS

| Re. 26,749 | 1/1970 | Montagu . | | |
|---|---|---|---|---|
| 1,572,452 | 2/1926 | Thomas . | | |
| 2,488,734 | 11/1949 | Mueller . | | |
| 2,546,740 | 3/1951 | Goldberg . | | |
| 2,578,419 | 12/1951 | Gittings . | | |
| 2,635,155 | 4/1953 | Barr . | | |
| 2,882,459 | 4/1959 | Berglund . | | |
| 2,942,457 | 6/1960 | Sink . | | |
| 3,177,385 | 4/1965 | Montagu . | | |
| 3,221,191 | 11/1965 | Cuches et al. . | | |
| 3,343,012 | 8/1964 | Scott . | | |
| 3,434,082 | 4/1987 | Montagu . | | |
| 3,624,574 | 11/1971 | Montagu | .............................. | 324/97 |
| 3,891,922 | 6/1975 | Atzinger | .......................... | 324/151 R |
| 3,959,673 | 5/1976 | Montagu . | | |
| 3,970,979 | 7/1976 | Montagu . | | |
| 4,076,998 | 2/1978 | Montagu . | | |
| 4,135,119 | 1/1979 | Brosens . | | |
| 4,142,144 | 2/1979 | Rohr . | | |
| 4,186,332 | 1/1980 | Montagu . | | |
| 4,187,452 | 2/1980 | Knappe et al. . | | |
| 4,392,089 | 7/1983 | Lester et al. | .................... | 340/825.73 |
| 4,462,014 | 6/1984 | Montagu . | | |

Primary Examiner—Reinhard J. Eisenzopf
Assistant Examiner—Anthony L. Miele
Attorney, Agent, or Firm—Chilton, Alix & Van Kirk

[57] ABSTRACT

A vane-type galvanometer employs a stator having a unibody type structure. Narrow bridge regions of the stator are magnetically saturated to produce regions of high magnetic reluctance and salient magnetic poles in the stator. A pre-wound bobbin is mounted to the stator for generating a control flux to thereby exert a torque on a vane armature.

16 Claims, 5 Drawing Sheets

ROTARY DISPLACEMENT MOTOR

BACKGROUND OF THE INVENTION

This invention relates generally to vane galvanometer type electromagnetic actuators or motors. More particularly, the present invention relates to compact electromagnetic motors which employ an armature of unpolarized magnetic material to provide limited rotary displacement.

Moving iron type galvanometers have long been employed in connection with optical scanning systems for controlling the angular position of various optical elements. Such moving iron galvanometers have also found application in laser scanning systems, phototypesetting, infrared scanning systems, resistor trimming and film technology, photo transmission by wire, point of sale scanners, pen chart recorder motors and numerous other applications. The foregoing applications employ highly responsive moving iron galvanometers having a limited angular rotation. The noted applications dictate that the motors be relatively compact and light weight, and have a rugged construction while providing a high performance with a relatively low power consumption. Such applications also require a torque response which is linear in relation to the applied input current.

In Jean I. Montagu U.S. Pat. No. 3,624,574, a limited rotation electromechanical actuator for an electro optical device employs an iron vane rotor. The rotor has a relatively high permeability and is mounted between two poles, at least one of which is divided into two spaced pole pieces. A permanent magnet provides a biasing flux through the rotor or armature between pairs of the pole pieces. A control coil provides a series magnetomotive force to unbalance the stator distribution of the permanent magnetic biasing of the rotor for applying a magnetic field induced torque to the rotor. The separated pole pieces have opposed surfaces which define a working gap between salient magnetic poles.

In Jean I. Montagu U.S. Pat. No. Re. 26,749, an electromagnetic motor for limited rotation employs a rotor which is rotatable about an axis relative to a stationary assembly comprising a pair of poles. Each of the poles has a pole face describing an arc of a circle having a center on the rotor rotational axis. The rotor has a first surface which is closely radially spaced from the face of the first pole by a first gap and a second surface which is closely radially spaced from the face of the second pole by a second gap. The first and second rotor surfaces describe an arc of a circle having centers on the same rotational axis. The motor has an armature/rotor of relatively high permeability material such as soft iron which is journaled for rotation around an axis parallel to a pair of stationary poles disposed on diametrically opposite ends of the armature. A permanent magnet supplies the static field passing from one pole to the other through the armature so as to produce a balanced bias magnetic flux. At least one of the poles is separated by a slot extending parallel to the armature axis and dividing the pole into a pair of pole pieces. The armature extends across the slot and is thus disposed opposite a portion of each of the pole pieces As described in U.S. Pat. No. Re. 26,749, current through a control coil mounted on the stator develops a magnetic field which extends from one of the pole pieces into the armature and back into the other pole piece. The control field developed by the coil adds to the static field on one side of the slot and subtracts from it on the other side so that the armature becomes subjected to a force in the direction of the stronger field. The linearity characteristics of the motor are enhanced by selective shaping of the armature such as by means of a notch or slot therein.

Electric motors which are employed as pen drives, scanners, servomotors, and meter drives are ordinarily configured so that the motors respond linearly against a spring force as a function of the input current applied to the motors. In compact motors such as disclosed in the aforementioned U.S. Pat. No. 3,624,574 and U.S. Pat. No. Re. 26,749, stator permanent magnet sources are employed. Desired linearity characteristics are provided but at the expense of a limitation in angular displacement of the rotor. The rotary displacement limitation is due to the rotor polar interface coacting with the pole pieces of th cooperating stator pole simultaneously so that the maximum flux from both permanent magnet sources is not distributed through a single pole piece. The angular rotation of the rotor is thereby limited (on the order of 30°) by the rotor pole face arc which spans the stator gap between the stator pole pieces. An increase in the armature pole face arcuate width results in a corresponding increase in the percentage of non-working flux which constitutes direct flux leakage. The direct flux leakage contributes to the frequency limiting response inherent in such motor designs. As the limits of the magnitude of the rotary displacement are approached, the linearity is assured by contouring the armature so as to cause a reduction in the circuit air gap progressively with the increasing angular displacement of the rotor. The corresponding increase in circuit permeance provides torque compensation to generally maintain linearity with the rotor displacement.

In a series coupling of a double ended armature circuit/stator circuit of a type such as disclosed in U.S. Pat. No. 3,624,574 and U.S. Pat. No. Re. 26,749, all flux emanating from one rotor pole must also couple through the opposite rotor pole (except for any leakage). Any direct coupling through flux which seeks the uniform gap length radially from the rotor to the stator is essentially non-working leakage which serves to saturate the circuit section and inhibit the rate of change of flux through the control coil inductance thereby limiting the frequency of response of the instrument. Prior art actuators or drives which employ double ended vane armatures essentially double the ampere turns access to the armature and double the active armature surface to generate torque in a maximum balanced system as compared to single configurations. Such a configuration provides certain advantages in exchange for essentially doubling the inertia and a more complex magnetic circuit. The structural complexity, however, presents many potential problems from an alignment and adjustment standpoint. The conventional double ended vane type structure achieves separation of the magnetically salient poles by essentially providing physically salient poles which are isolated by an axial slot or gap to separate the stator into pole pieces. In operation, the current flowing through the control coil serves to suppress one permanent magnet flux tube while shifting the other proportionally to the stator pole on the opposite side of the coil such that one flux source at the stator pole is enhanced while the other is suppressed. The unbalanced torque condition thus causes rotation in the driven direction in proportion to the relative magnetic field intensity and area as opposed to a change in circuit reluctance due to change in the length of the magnetic circuit as is operational in relay type drives.

Prior art vane galvanometer devices of the type previously described exhibit a slower response than desired for many applications, employ magnets which are expensive and relatively bulky. For example, the magnets may require a 5:1 length to cross section ratio to support the required bias flux. The devices are also limited in arcuate displacement and relatively inefficient. The inefficiencies are manifest not only in the required system bulk and weight but also in the large number of discrete components which must be balanced and calibrated during assembly in order to provide an instrument of appropriate response and accuracy.

Galvanomotors of a type such as disclosed in the aforementioned Montagu patents have exhibited very favorable operational characteristics in optical systems and other applications. However, such galvanometers present certain problems and disadvantages from the standpoint of cost and manufacturing efficiency. The slots between pole pieces must be made to precise dimensional tolerances. The control coil assembly is constructed in a relatively inefficient manner. Conventional assembly entails use of a mandrel, space frames, and clamping fixtures to prepare the stator assembly for potting or injection molding of a permanent frame structure.

Accordingly, it is a principal aim of the present invention to provide a new and improved rotary displacement motor which overcomes the noted manufacturing and cost deficiencies of related prior art devices.

SUMMARY OF THE INVENTION

Briefly stated, the invention in a preferred form is a rotary displacement motor in the form of a vane type galvanometer wherein the stator assembly has a unibody type construction. The stator assembly in one embodiment forms a continuous surface of revolution which defines the rotor opening. The conventional slots or gaps which divide the stator into pole pieces are replaced by narrow isthmuses or bridges of the stator body. The narrow isthmus or bridge structures become saturated with magnetic flux and hence magnetically function in a manner analogous to "air gaps" of conventional stator assemblies. A consequent feature provided by the stator assembly is that the control coils may be pre-wound on bobbins and/or coil cores and mounted to the stator assembly. The pre-winding provides for a lower cost construction and a greater number of ampere-turns (and hence torque) per unit volume of the motor.

An object of the invention is to provide a new and improved rotary displacement motor of compact rugged form which is relatively inexpensive and can be assembled in a highly efficient manner.

Another object of the invention is to provide a new and improved rotary displacement motor which has a relatively high sensitivity in terms of torque to current ratio.

Another object of the invention is to provide a new and improved rotary displacement motor which permits the pre-winding of the control coil upon an unmounted bobbin-type structure and subsequent assembly to the stator rather than winding the coil through a slot of the assembled stator circuit.

A further object of the invention is to provide a new and improved rotary displacement motor wherein the stator may be formed of a sturdy unibody type construction which does not require honing of the inside portions thereof and the dimensions of the air gap between the armature and the stator may be precisely controlled in an efficient manner in a die without clamping the motor assembly on a mandrel.

Other objects and advantages of the invention will become apparent from the drawings and the specification.

DETAILED DESCRIPTION OF THE INVENTION

Figure 1:
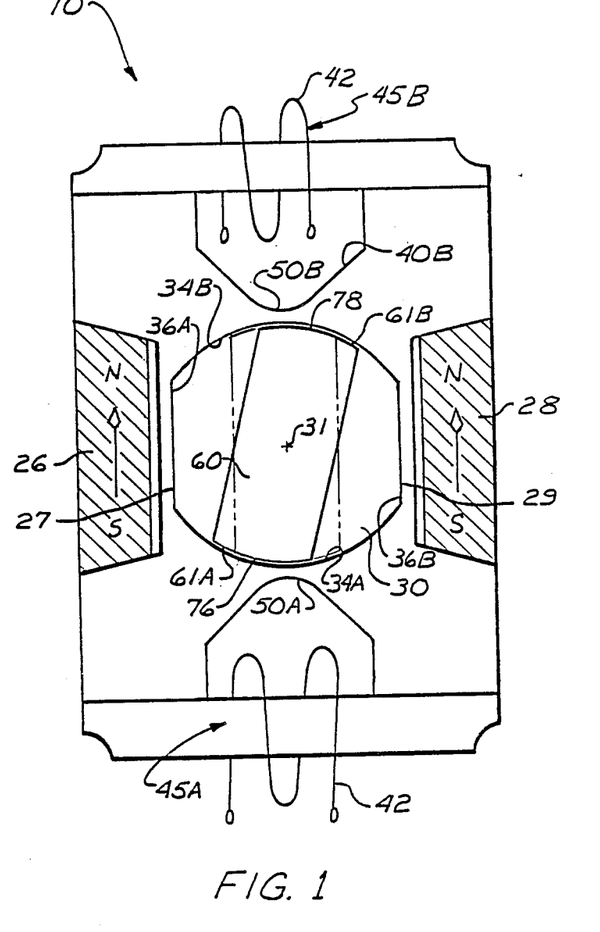
FIG. 1 is a schematic of a rotary displacement motor in accordance with the present invention.
Figure 2:
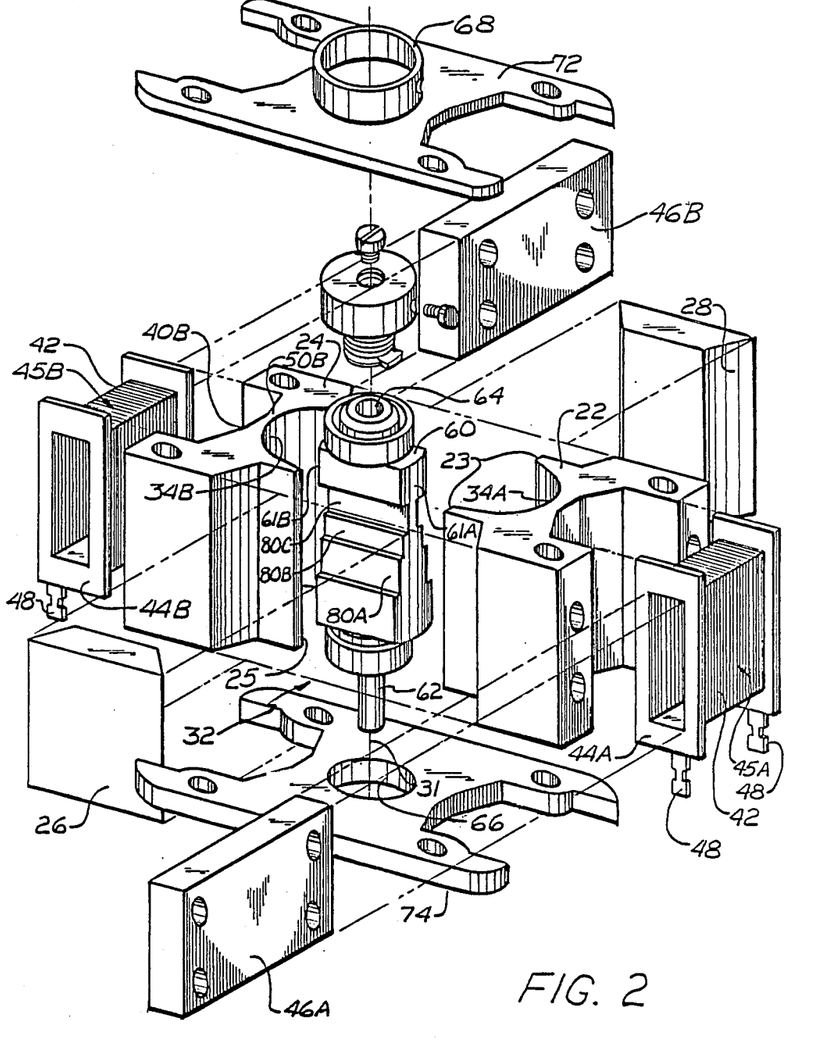
FIG. 2 is an exploded view of the rotary displacement motor of FIG. 1.

With reference to the drawings wherein like numerals represent like parts throughout the several figures, a rotary displacement motor in accordance with the present invention is generally designated by the numeral 10 in FIGS. 1 and 2. Motor 10 is a vane galvanometer having a highly efficient and compact construction. Motor 10 has particular applicability as a pen motor drive for a chart recorder or a scanner motor.

Motor 10 comprises a stator assembly 20 of integrated form which functions as both a principal frame structure and a principal magnetic circuit element. The stator assembly 20 is manufactured from relatively high permeability material such as a 50 percent Ni-50 percent Fe alloy, Si-Fe powdered metal, or Carpenter 49 alloy which can support a flux density of 14 kilogauss. Carpenter 49 is a suitable material because of the 180° polarity reversal properties and relatively low hysteresis properties. As detailed below, the salient stator poles are formed by nearly completely saturating portions of the stator assembly such that the stator circuit permeability of the saturated portions is approximately 3 mu.

The stator assembly 20 comprises two substantially identical, opposing laminated pole pieces 22 and 24. The pole pieces 22 and 24 have respective spaced pairs of co-planar ends 23 and 25 which abut in end-to-end fashion. The stator assembly 20 defines a central rotor opening 30 for receiving the vane rotor or armature assembly designated generally by the numeral 32. The rotor opening 30 has a central axis 31 and generally uniform cross section which extends longitudinally through the stator laminate. The rotor opening 30 is defined by opposing arcuate walls 34a and 34b of the opposing respective pole pieces 22 and 24 and by generally parallel opposing planar surfaces 36a and 36b which extend generally perpendicular to the opposed medial ends 23 and 25. The arcuate walls 34a and 34b are circular sections having a center on axis 31. The pole pieces cooperate to form spaced trapezoidal receptacles for receiving complementary shaped permanent magnets 26 and 28. Parallel narrow bridges 27 and 29 are formed in the stator assembly between the respective permanent magnets 26 and 28 and the rotor opening 30.

Transversely opposed ends of the stator pole pieces define axially extending, quasi-C-shaped recess 40a and 40b. Insulated wire 42 is pre-wound around a pair of plastic bobbins 44a and 44b to form a pair of control coils 45a and 45b, respectively. The control coils 45a and 45b are received in the respective recesses 40a and 40b. The control coils are secured to the stator body assembly by coil cores 46a and 46b which are bolted to the outer end surfaces of the stator assembly. Terminal pins 48 project from the control coils for electrically connecting the control coils with the circuitry of the electrical power supply. The pole pieces form respective narrow, longitudinally extending isthmuses 50a and 50b which are disposed at diametrically opposed positions between the control coils and the rotor opening 30. The isthmuses 50a and 50b are narrow so as to facilitate magnetic flux saturation as described below.

The permanent magnets 26 and 28 are substantially identical and each has one S pole which abuts against pole piece 22 and an opposing N pole which abuts against pole piece 24 as diagrammatically illustrated in FIG. 1. The permanent magnets may be secured in the assembly in a variety of ways including epoxy. In a preferred form as illustrated in FIGS. 1 and 2, the permanent magnets are alnico alloy magnets having a trapezoidal form which is complementary with the trapezoidal receptacles formed in the stator assembly.

The rotor assembly 32 comprises an armature 60 which is made from a single piece of high permeability material such as soft iron, Carpenter 49 alloy or Si-Fe powdered material. The armature 60 has a pair of integrally projecting shafts 62 and 64 which are journaled into radial bearings (not illustrated). A torsion bar (not illustrated) may be affixed coaxially to shaft 62 and affixed eccentrically at one end to a fixed base at an angle to the armature rotational axis 31 so as to be in a state of flexure. The angle is sufficient so as to produce forces on the armature to thereby press the armature tight against one side of one radial bearing and the opposing side of the other radial bearing.

A static sleeve 68 is secured to a plate 72 for adjusting the torsion bar spring zero position with respect to the magnetic zero position of the magnetized rotor upon assembly. The torsion bar spring functions to maintain the rotor from displacement to take up the bearing clearance to thereby prevent an undesirable cyclic change in torque characteristics. In one form of the invention, both the armature 60 and the stator pieces 22 and 24 are fabricated from powdered metal having a density on the order of 7.2. The armature may also be composed of 3½ percent Si-Fe as opposed to a 50 percent Ni-Fe alloy. The rotor assembly is mounted by means of top and bottom plates 72 and 74, respectively, which are secured against corresponding top and bottom surfaces of the stator pole pieces.

The armature 60 is a vane-like member having opposite arcuate ends 61a and 61b closely spaced from concentric faces 34a and 34b by air gaps 76 and 78, respectively. The linearity of the armature in terms of rotary displacement in response to applied current is enhanced by means of pairs of secantial or chordlike notches 80a, 80b, 80c, etc. which traverse the elongated flat surfaces of the armature between the curved end surfaces 61a and 61b conformal with the arcuate pole pieces defining opening 30. The latter armature construction enhances the linearity of operation by increasing the reluctance of the magnetic circuit between the armature and the stator pole at the trailing edge of the rotor faces 61a and 61b so that the magnetomotive torque exerted on the armature is substantially independent of the angle of rotation as will be further described below. The shaft 64 may connect with or carry a pointer or pen (not illustrated) depending on the use of the motor or other application (which is not illustrated in the drawing). The inertial mass of the armature may be reduced as compared to conventional armatures of related ganvanometers thereby increasing the motor frequency response.

The magnetic polarity which is induced by the two permanent magnet sources is such that without an additional external source bias, the armature 60 will be at rest at a minimum magnetostatic energy level (as illustrated in broken lines in FIG. 1). It will be appreciated that the resultant salient poles of the dual permanent magnet bias are not structurally isolated as in conventional devices to which the invention relates but are essentially shorted out via the isthmuses 50a and 50b. The isthmuses 50a, 50b are saturated by the induced magnetization of the armature by the permanent magnet field bias. The Carpenter 49 material employed in some preferred embodiments of the invention commences saturation at approximately 9 kilogauss.

It is theorized that pursuant to the principles of dominance exclusion, the permanent magnetic bias circuit thereby blocks the flux due to the ampere turns of the control coils. The permanent magnetic flux is manipulated by the magnetomotive force of the control turns of the control coil. In the embodiments wherein the pole faces of the armature coact with the stator poles of the control coil, the induced magnetism of the armature is of sufficient flux density at the gap (due to biasing field of the parallel permanent magnets) that the isthmus of permeable material which normally would short out to the flux from the windings is saturated to dominate the potential flux due to the magnetomotive force of the control turns thereby excluding that flux. Consequently, there is no separate flux in response to generating a magnetic force in the control coils. The coils essentially merely displace the isopotential of the bias generated by the permanent magnets. The induced magnetization by the stator permanent magnets bias through the rotor to behave as a permanent magnet in vane motors wherein the rotor is operated perpendicularly to the coils. In vane motors wherein the rotor is disposed with the rotor axis pole perpendicular to the permanent magnet, the polarity of the magnetization is caused to rotate 180 degrees during the time interval when the rotor rotates on the order of ±15 degrees.

The magnetic reluctance equivalent of an "air gap" is thereby effected by the saturation, and no further magnetic field diversion will ordinarily occur. The virtual gap at the isthmuses 50a and 50b functions in the same manner as the conventional slot or working gap in related motors. While a portion of the permanent magnetic field is lost in a direct short through the isthmuses, such loss is saturation limited. The loss is also compensated by an increase in the permanent magnet bulk. It will be noted that the control coils 45a and 45b may be pre-wound on the bobbins at a significant cost advantage and at a higher density of ampere turns per unit volume. The absence of physical structural gaps in the stator assembly (as compared to conventional assemblies) assures structural ruggedness and precise alignment between the armature and the arcuate surfaces of the rotor opening.

For vane motors wherein the length of the rotor is perpendicular to the axis of the permanent magnets, the armature undergoes polarity reversal during a complete displacement of the armature at the moment of rotation. When the rotor is oriented perpendicular to the coil axis, the magnetization remains constant throughout the rotor rotation.

Figure 3:
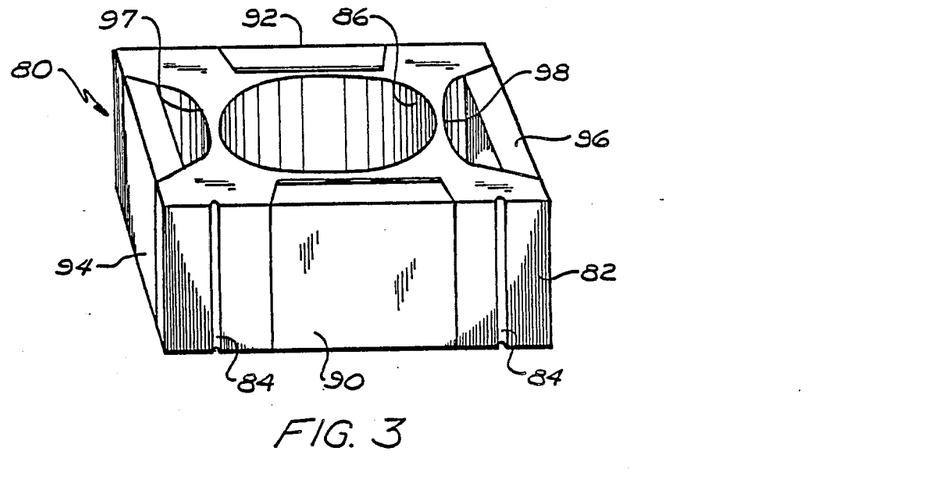
FIG. 3 is a fragmentary perspective view of a second embodiment of a rotary displacement motor in accordance with the present invention.

With reference to FIG. 3, a unibody vane galvanometer exhibiting a very rugged and compact configuration is generally designated by the numeral 80. The stator 82 is of a unibody laminar form which may be die formed from powdered metal or other high permeability materials such as described in relation to stator assembly 20. The laminations are held together by parallel axial weldments 84. The unibody construction of the stator 82 provides for a rotor opening 86 which is essentially defined by a continuous surface of revolution. The rotor opening 86 may be formed and completely shaped by the dies which form the stator 82. Consequently, the stator 82 may assume the form of a unitary laminated stack of high permeability metallic laminate which are aligned and welded together o as to function as a structurally sturdy support frame for the permanent magnets 90 and 92 and the steering coils 94 and 96.

The steering coils 94 and 96 may be bobbin wound coils having tapered core pieces which are mounted to complementary locking tapers of the stator body. The permanent magnets 90 and 92 may also be mounted to a zero clearance with the stator stack. It will be appreciated that the assembly of the permanent magnets and the coils to the stator is relatively easily accomplished and is independent of the pre-established inside diameter geometry and concentricity of the rotor opening 86. Honing of the rotor opening 86 for requisite alignment with the armature may be essentially eliminated. Furthermore, no substructure or auxiliary alignment structures are required for the modular assembly of FIG. 3.

The galvanometer 80 can be covered with an aluminum can or plastic (neither illustrated). Both the armature/rotor (not illustrated) and the stator 80 may be fabricated from powdered metal having a density on the order of 7.2. The galvanometer 80 exhibits an efficient rugged construction which is characterized by both mechanical and thermal stability. It will be appreciated that the assembly process for the stator 82 does not require that the stator be assembled by use of a mandrel, spacing frames or clamping fixtures so as to pre-position discrete components of the stator assembly for potting or injection molding to a permanent frame structure.

In operation, the unibody vane galvanometer 80 is theorized to function on the principle of dominance exclusion as previously described in relation to motor 10. The flux due to the ampere turns of the steering coils 94 and 96 is blocked by the intense induced field of the rotor vane. The reduced bridge portions 97 and 98 of the unibody stator are saturated by the induced magnetization of the rotor by the permanent field bias of the permanent magnets 90 and 92. Barring minor leakage there is essentially no separate flux in response to generating a magnetomotive force in the control or steering coils 94 and 96. The coils may be viewed as merely displacing the isopotential of the permanent magnet bias which is a direct current field induction.

Figure 7:
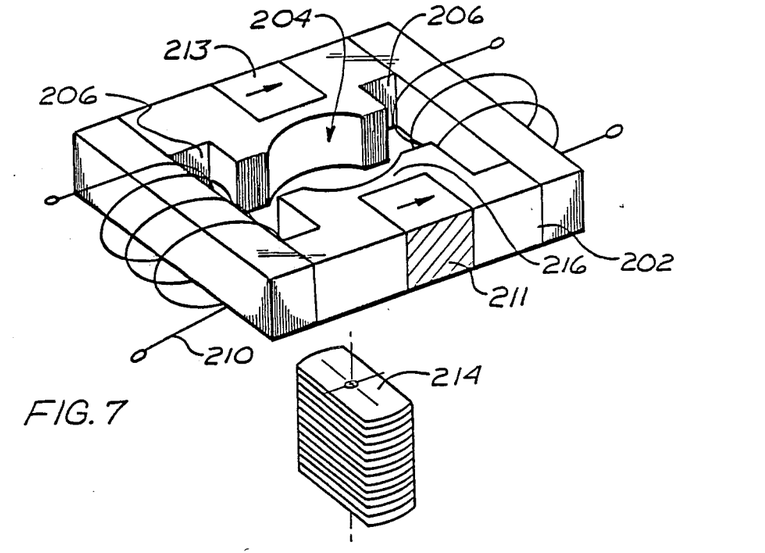
FIG. 7 is a schematic view of a fifth embodiment of a rotary displacement motor in accordance with the present invention.
Figure 8:
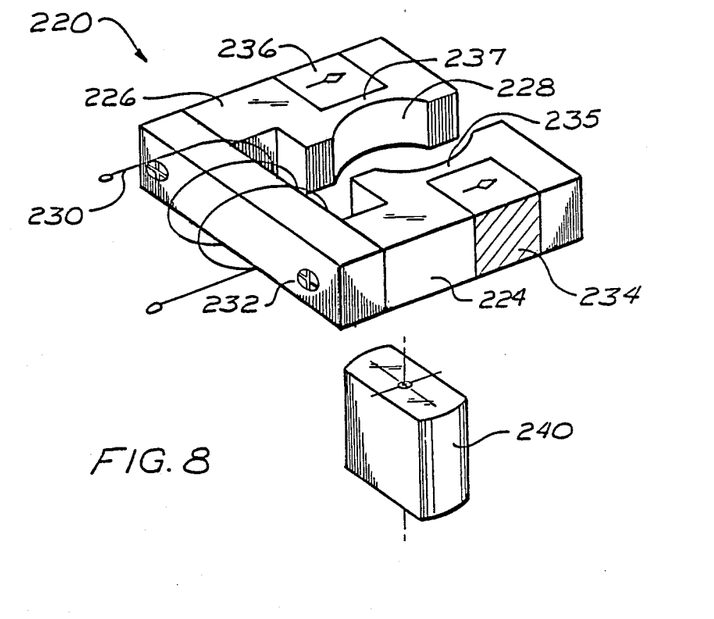
FIG. 8 is a schematic view of a sixth embodiment of a rotary displacement motor in accordance with the present invention.

With reference to FIGS. 7 and 8, the stator body in some applications may be configured so as to directly span the region between the permanent magnets and the rotor but not the control coils while retaining the overall unibody type stator assembly construction. The vane galvanometer 200 of FIG. 7 comprises a stator body 202. The stator body 202 may be formed from high permeability materials as previously described so as to define a dual open ended, central rotor opening 204 which communicates at diametral ends with winding recesses 206. Opposing control coils 210 and 212 are wound on removeable core pieces and are partially positioned in the winding recesses 206. The core pieces may be directly wound or pre-wound on bobbins which are slipped over the core pieces. Diametrically opposed permanent magnets 211 and 213 are mounted at opposing locations of the stator body to generate the permanent bias flux. The rotor 214 having a laminar construction is journaled in the rotor opening 204 for rotation from a reference position which is generally perpendicular to the bias flux lines of the permanent magnets. Narrow bridges of the stator body at 216 and 218 function as the magnetic equivalent of an "air gap" as previously described.

With reference to FIG. 8, a vane galvanometer 220 which has application as a line fault indicator employs a single control coil 230. The stator body comprises two pole pieces 224 and 226 having opposed arcuate-shaped ends which cooperate to form a dual open ended rotor opening 228. The control coil 230 is wound around a bar 232 which is bolted or otherwise secured with minimum circuit gaps to the ends of the pole pieces. Permanent magnets 234 and 236 are mounted in complementary recesses of the pole pieces. The respective pole pieces are configured to form narrow bridges at 235 and 237, respectively, interposed between the permanent magnets and the rotor opening. During operation the bridges constitute regions of high magnetic reluctance which function as the equivalent of a magnetic "air gap" as previously described. The rotor 240 which may be similar in form and function to armature 60 is journaled in the rotor opening. A resultant torque displaces the rotor 240 from its reference position generally perpendicular to the biasing flux of the permanent magnets for angular rotation in response to input electric current applied to the control coil 230.

Figure 4:
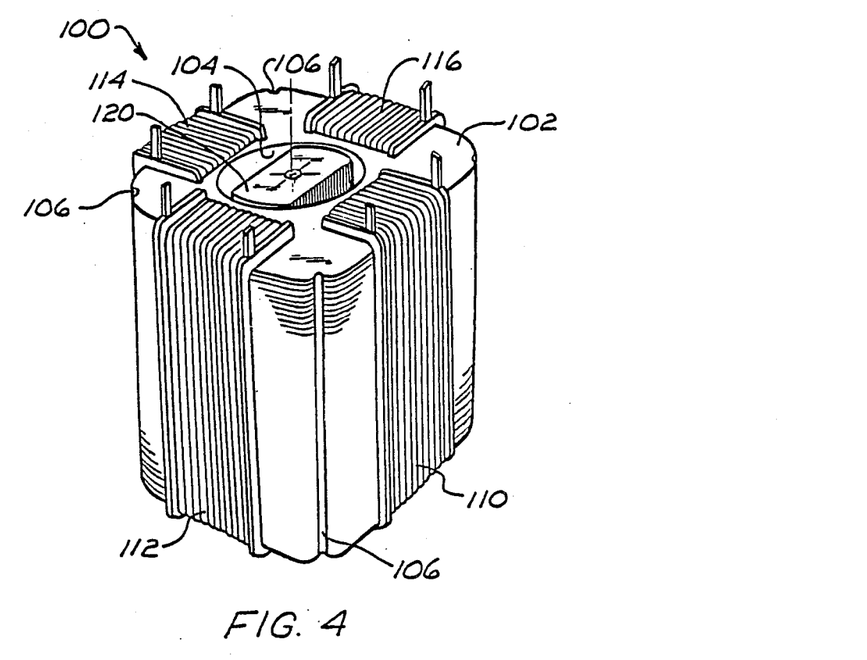
FIG. 4 is a fragmentary perspective view of a third embodiment of a rotary displacement motor in accordance with the present invention.
Figure 5:
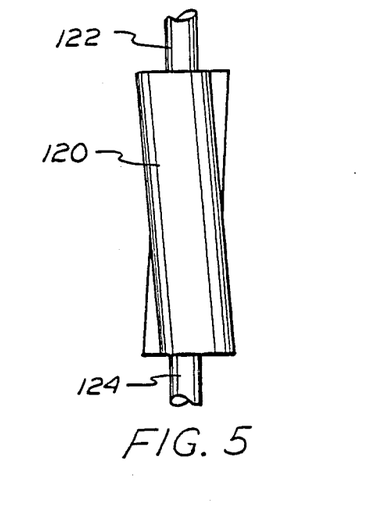
FIG. 5 is a fragmentary axial view of the rotor assembly for the motor of FIG. 4.

With reference to FIGS. 4 and 5, a motor designated generally by the numeral 100 is adapted for continuous 360 degree drive rotation. The motor 100 exploits the unibody stator concepts previously described for limited rotation galvanometers. The motor 100 employs a laminated stator 102 having a unitary construction and defining a central rotor opening 104. The rotor opening 104 is defined by a continuous wall formed by the iron laminations of the stator. The laminations are secured together by weldments 106. Bobbin wound coils 110, 112, 114 and 116 of copper wire are circumferentially disposed about the stator frame in equiangular spaced relationship. The coils are bobbin wound prior to assembly with the stator. The iron rotor 120 includes axially opposed shaft portions 122 and 124 which may be journaled to the assembly for rotatably mounting the rotor. The rotor 120 may be permanently magnetized (not illustrated) or have an iron vane construction which depends on induction of polarization for its bias as a rotor.

The motor assembly 100 may be used as enhanced variable reluctance, two phase AC synchronous motor, a DC brushless motor, a DC servomotor, an incremental stepper or linear torque motor. Magnetic flux emanating from either permanent magnet sources (not illustrated) or selected electromagnetic coils bias the rotor to a permanent magnetic polarity. The rotor 120 is induced to be a permanent magnet. Consequently, the flux density is two to three times higher at the rotor/stator interface than a comparable construction which employs ferrite/alnico or rare earth compositions. The magnetic dominance of the rotor in its cross coupling with the stator functions to preclude the flux from the steering coils from turning out through the iron stator connector between the magnetic poles of the stator. Consequently, the magnetic pattern within the motor assembly functions as though there were a physical separation, i.e. slots or gaps, separating the salient stator poles such as occurs in conventional related motors.

The coaction of the circumferential ampere turns sources forms diametrically appearing poles at the stator pole surfaces which establishes a maximum potential energy dipole. The saturated soft iron rotor undergoes rotary displacement toward the dipole. The rotating magnetic stator dipole results in a corresponding rotation or oscillation of a high mu, low inertial mass, iron induced dipole. A highly efficient motor of very low cost construction is thus provided. The opposing coils may be driven in parallel or series to establish a two phase motor arrangement for analog or digital AC operation. For maximum efficiency, one opposing coil pair acts as a permanent magnet bias while the other opposing coil pair operates by coupling with each rotor half to steer the bias flux resulting in the development of magnetic fields which have a very high coil conductance constant relative to standard motors.

The illustrated motor assembly 100 is relatively inexpensive in its construction. The magnetic circuit "air gaps" may be precisely implemented and the motor assembly may be constructed so as to yield a constant torque/degree displacement. It should be appreciated that a rotor 120 having a minimal diameter and operating as a direct current circuit at magnetic saturation at all times offers the highest torque/inertia ratio and therefore the maximum acceleration for a given frame size and thermal capacity. The bobbin wound coil arrangement provides an inexpensive circuitry for switching and winding arrangement. The stator iron exhibits very high utilization throughout the time of operation so the total flux per pound of available circuit iron is high. Consequently, both a high torque per mass of motor and a high torque per volume of motor are provided. It should be appreciated that the motor also provides a stator shunting which is made possible by maintaining an induced DC field bias on the rotor. Consequently, the motor may be constructed without the conventional gaps or slots for pole separation nor the problems associated with the coil windings.

For additional applications (not illustrated), numerous types of motors and applications may be provided by altering the phases, drives and sequences of the coils. For example, a ten position indicator of very high efficiency could be manufactured using ten coils and maintaining as a bias eight coils at a direct current level while changing but two coils from positive to negative polarity.

Figure 6:
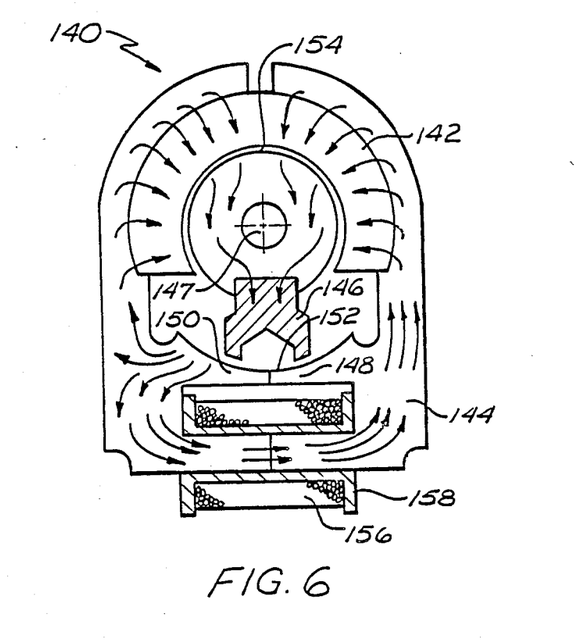
FIG. 6 is a transverse sectional view, partly in schematic, of a fourth embodiment of a rotary displacement motor in accordance with the present invention.

With reference to FIG. 6, a polarized actuator for linear displacement in response to input current is designated generally by the numeral 140. An arcuate shaped permanent magnet 142 is magnetized as a pair and isolated by a stator 144. The stator 144 may be manufactured from materials as previously described. A single sided armature 146 has a bifuracted radial pole which extends from the rotor shaft 147. The stator 144 has a continuous arcuate face 152 which spans two magnetically salient poles 148 and 150 of the stator. The center of pole face 152 is eccentric with the rotational axis of the shaft 147. A polarity is induced in armature 146. The armature coacts with the uninterrupted stator pole having two magnetically salient poles 148 and 150. The salient poles, however, are continuous and do not have a physical gap so as to structurally define or separate the poles. The magnetic circuit is schematically illustrated by the arrows in FIG. 6. A control coil 156 which is wound on bobbin 158 functions to generate a torque of armature 146 in response to input current.

The permanent magnet 142 is composed of a ferrite type or rare earth material which permits the utilization of the very high energy products attainable with short series dimensions. The magnet 144 is wrapped essentially around a collector surface 154 of the rotor at a low inertial radius. The foregoing structure permits a flux density equivalent to that attainable by the use of expensive alloys of alnico. The increased coercive force of the ferrites and rare earth magnets prevent accidental degaussing due to magnetic noise.

A certain quantity of negative emf is generated because of the inductance and rapid development of a magnetic field. The excessive negative emf slugs response since the through put leakage directly contributes to negative emf. The close coupling of one inductor pole of the armature makes it essential that the driving surfaces of the other end are optimized for working flux. The minimizing of direct leakage is accomplished by presenting a narrow arcuate dimension of the radial "air gap" in the regions of face 152. The bifurcation configuration of the armature 146 increases the working area without increasing slugging flux or direct non-working leakage. The resulting actuator 140 may be constructed at a reduced cost of materials while providing improved performance in terms of response, amplitude and torque to inertia ratio.

While preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and the scope of the present invention.

I claim:

1. A vane galvanometer comprising:
    a stator having a unibody construction of a material having a high magnetic permeability, said material forming a substantially continuous arcuate surface completely surrounding a central rotor opening;
    a vane rotor of permeable material received in said opening and rotatable relative to said stator about an axis from a reference angular position;
    permanent magnetic means comprising a pair of permanent magnets mounted to said stator at diametral positions relative to said opening for generating a permanent bias flux through a magnetic path that includes said stator and rotor wherein diametral stator regions of said stator are saturable to form regions of high reluctance generally parallel to said axis and salient magnetic poles in said stator; and control flux means comprising a control coil mounted to said stator for generating a control flux through permeable portions of said stator so that a current applied to said control coil produces a torque for angularly displacing said rotor about said axis.

2. The galvanometer of claim 1 wherein said control flux means comprises two control coils positioned at diametrically opposing locations relative to said rotor opening.

3. The galvanometer of claim 1 wherein said control coil comprises wire wound on a bobbin which is mounted to said stator.

4. The galvanometer of claim 1 wherein said stator comprises laminate having a high magnetic permeability.

5. The galvanometer of claim 1 wherein said stator comprises powdered metal, having a high magnetic permeability.

6. The galvanometer of claim 1 wherein said rotor opening is defined by opposed arcuate walls of said stator, said walls having a center on said rotor axis.

7. A vane galvanometer comprising:
a stator assembly comprising a connected structure having a continuous wall defining a central rotor opening and forming first and second opposed narrow bridge connector pairs adjacent said opening;
a vane rotor of high permeability received in said opening and rotatable relative to said stator assembly about an axis from a reference position;
permanent magnetic means comprising a pair of permanent magnets mounted to said stator at diametral positions relative to said opening, said first bridge connectors being interposed between said respective magnets and said opening, for generating a permanent bias flux through a magnetic path that includes said stator assembly and rotor wherein said bridges are saturatable to form regions of high magnetic reluctance and salient magnetic poles in said stator assembly; and
control flux means comprising a control coil mounted to said stator assembly for generating a control flux through permeable portions of said stator so that a current applied to said control coil produces a torque for angularly displacing said rotor about said axis.

8. The galvanometer of claim 7 wherein said control flux means comprises two control coils positioned at diametrically opposing locations relative to said rotor opening.

9. The galvanometer of claim 7 wherein said control coil comprises wire wound on a bobbin which is mounted to said stator assembly.

10. The galvanometer of claim 7 wherein said stator comprises laminae having a high magnetic permeability.

11. The galvanometer of claim 7 wherein said stator comprises powdered metal having a high magnetic permeability.

12. A vane galvanometer comprising:
a stator assembly comprising a pair of spaced pole pieces having narrow bridge regions adjacent opposed arcuate ends which define a rotor opening;
a vane rotor of permeable material received in said opening and rotatable relative to said stator assembly about an axis from a reference position which generally aligns with said bridge regions;
a pair of permanent magnetic means mounted to said pole pieces adjacent said bridge regions for generating a permanent magnetic flux through a magnetic path that includes said stator assembly and rotor wherein said bridge regions saturable to form regions of high reluctance and salient magnetic poles in said stator assembly; and
a control coil mounted to said pole pieces for generating a control flux through permeable portions of said stator assembly so that a current applied to said control coil produces a torque for angularly displacing said rotor about said axis.

13. A method for producing an angular displacement in a rotor of a vane galvanometer having a rotor rotatable in an opening of a stator assembly comprising:
(a) providing a stator assembly having diametrically opposed bridges interposed between enlarged stator structures defining a magnetically permeable region;
(b) applying a permanent magnetic bias to said stator assembly to generate a permanent magnetic flux through a path that includes said rotor and stator assembly;
(c) saturating said bridges with permanent magnetic flux so as to form regions of high reluctance and salient magnetic poles in said stator assembly; and
(d) generating a control magnetomotive force through said permeable regions of said stator assembly to thereby angularly displace said rotor.

14. The method of claim 13 wherein a control coil is mounted to said stator assembly and wherein step (d) further comprises applying an electrical current to said control coil.

15. A method of manufacturing a vane galvanometer comprising:
(a) constructing a stator assembly having an integrated connected configuration defining a rotor opening and narrow bridge structures at diametral locations relative to said opening;
(b) mounting a rotor in said opening;
(c) mounting a permanent magnetic means to said stator assembly;
(d) winding an electrically conductive wire on a bobbin to form a control coil; and
(e) mounting said wound bobbin to said stator assembly.

16. The method of claim 15 wherein step (a) further comprises forming a one-piece stator assembly of integral form.

* * * * *